(12) United States Patent
Akinwande et al.

(10) Patent No.: US 10,242,884 B2
(45) Date of Patent: Mar. 26, 2019

(54) INTEGRATION OF AIR-SENSITIVE TWO-DIMENSIONAL MATERIALS ON ARBITRARY SUBSTRATES FOR THE MANUFACTURING OF ELECTRONIC DEVICES

(71) Applicant: Board of Regents, The University of Texas System, Austin, TX (US)

(72) Inventors: Deji Akinwande, Austin, TX (US); Li Tao, Austin, TX (US); Carlo Grazianetti, Borgo Ticino (IT); Alessandro Molle, Vimercate (IT)

(73) Assignees: Board of Regents, The University of Texas System, Austin, TX (US); Consiglio Nazionale delle Ricerche (IT)

( * ) Notice: Subject to any disclaimer, the term of this patent is extended or adjusted under 35 U.S.C. 154(b) by 0 days.

(21) Appl. No.: 15/693,827

(22) Filed: Sep. 1, 2017

(65) Prior Publication Data
US 2018/0013009 A1    Jan. 11, 2018

Related U.S. Application Data

(62) Division of application No. 15/208,244, filed on Jul. 12, 2016.
(Continued)

(51) Int. Cl.
*H01L 21/3213*    (2006.01)
*H01L 21/683*    (2006.01)
(Continued)

(52) U.S. Cl.
CPC .... *H01L 21/32133* (2013.01); *H01L 21/0242* (2013.01); *H01L 21/0259* (2013.01);
(Continued)

(58) Field of Classification Search
CPC ......... H01L 29/78651; H01L 21/02532; H01L 29/78603
See application file for complete search history.

(56) References Cited

U.S. PATENT DOCUMENTS 9,490,430 B1 *  11/2016  Chen ................. H01L 29/78696
2006/0154399 A1    7/2006  Sauer et al.
(Continued)

OTHER PUBLICATIONS

Li et al—Silicene field-effect transistors operating at room temperature—nature nanotechnology—vol. 10—pp. 227-231.*
(Continued)

*Primary Examiner* — Moazzam Hossain
*Assistant Examiner* — Long H Le
(74) *Attorney, Agent, or Firm* — Robert A. Voigt, Jr.; Winstead, P.C.

(57) ABSTRACT

A field-effect transistor and method for fabricating such a field-effect transistor that utilizes an air-sensitive two-dimensional material (e.g., silicene). A film of air-sensitive two-dimensional material is deposited on a crystalized metallic (e.g., Ag) thin film on a substrate (e.g., mica substrate). A capping layer of insulating material (e.g., aluminum oxide) is deposited on the air-sensitive two-dimensional material. The substrate is detached from the metallic thin film/air-sensitive two-dimensional material/ insulating material stack structure. The metallic thin film/ air-sensitive two-dimensional material/insulating material stack structure is then flipped. The flipped metallic thin film/air-sensitive two-dimensional material/insulating material stack structure is attached to a device substrate followed by having the metallic thin film etched to form contact electrodes. In this manner, the pristine properties of air-sensitive two-dimensional materials are preserved from degradation when exposed to air. Furthermore, this new tech-
(Continued)

nique allows safe transfer and device fabrication of air-sensitive two-dimensional materials with a low material and process cost.

15 Claims, 10 Drawing Sheets

Related U.S. Application Data

(60) Provisional application No. 62/191,651, filed on Jul. 13, 2015.

(51) Int. Cl.
  *H01L 21/02* (2006.01)
  *H01L 29/786* (2006.01)
  *H01L 29/66* (2006.01)
  *H01L 29/45* (2006.01)

(52) U.S. Cl.
  CPC .. *H01L 21/02178* (2013.01); *H01L 21/02381* (2013.01); *H01L 21/02521* (2013.01); *H01L 21/02532* (2013.01); *H01L 21/02535* (2013.01); *H01L 21/02631* (2013.01); *H01L 21/6835* (2013.01); *H01L 29/66772* (2013.01); *H01L 29/78603* (2013.01); *H01L 29/78654* (2013.01); *H01L 29/78696* (2013.01); *H01L 2221/68363* (2013.01)

(56) References Cited

U.S. PATENT DOCUMENTS

2008/0194069 A1  8/2008  Surdeanu et al.
2015/0144884 A1*  5/2015  Yamaguchi ......... H01L 29/1606
   257/29
2015/0206942 A1  7/2015  Glass et al.
2016/0104790 A1  4/2016  Oh
2016/0190244 A1  6/2016  Lee et al.
2017/0040418 A1  2/2017  Chen et al.
2017/0059514 A1  3/2017  Hoffman

OTHER PUBLICATIONS

Tao et al., "Silicene Field-Effect Transistors Operating at Room Temperature," Nature Nanotechnology, Feb. 2, 2015, pp. 1-5.
Tao et al., "Single/Bi-Layer Silicene Devices and Air Stability," presentation at American Physical Society March Meeting, Mar. 2-6, 2015, San Antonio, Texas, pp. 1-15.
Li Tao, "Experimental Investigation on Silicene-Based Field-Effect Transistor," MRS Spring Conference, Symposium NN4.07: 2D Materials and Devices beyond Graphene, San Francisco, CA, Apr. 23, 2014, pp. 1-17.
Aufray et al., "Graphene-like Silicon Nanoribbons on Ag(110): A Possible Formation of Silicene," Applied Physics Letters, vol. 96, 183102, 2010, pp. 1-3.
Vogt et al., "Silicene: Compelling Experimental Evidence for Graphene-like Two-Dimensional Silicon," Physical Review Letters, vol. 108, 155501, 2012, pp. 1-5.
Molle et al., "Hindering the Oxidation of Silicene with Non-Reactive Encapsulation," Advanced Functional Materials, vol. 23, 2013, pp. 4340-4344.
Office Action for U.S. Appl. No. 15/208,244 dated Nov. 28, 2018, pp. 1-19.

* cited by examiner

INTEGRATION OF AIR-SENSITIVE TWO-DIMENSIONAL MATERIALS ON ARBITRARY SUBSTRATES FOR THE MANUFACTURING OF ELECTRONIC DEVICES

GOVERNMENT INTERESTS

This invention was made with government support under Grant No. W911NF-13-1-0364 awarded by the Army Research Office. The U.S. government has certain rights in the invention.

TECHNICAL FIELD

The present invention relates generally to the application of air-sensitive two-dimensional materials, and more particularly to integrating air-sensitive two-dimensional materials (e.g., silicene) on arbitrary substrates for the manufacture of electronic devices.

BACKGROUND

Silicene, a two-dimensional honeycomb lattice of silicon atoms with similarities to graphene, has attracted interest both in terms of the fundamental physics behind its properties and new technologies that might exploit them. However, a stable form of the material has proved elusive, making it hard to pin down its characteristic properties and possible applications.

The two-dimensional silicon can be grown epitaxially and investigated in high vacuum. In the past, it was not expected to survive isolation from its parent substrate or exposure to air, and therefore, silicene transistors were not envisaged. However, thick multilayer silicene films have been currently demonstrated to be stable for at least 24 hours in the air.

While such a feat is exciting and will allow scientists to further probe the material and exploit the properties that have made silicene a promising material in the electronics industry, the silicene films can only be stable for 24 hours in the air thereby preventing the silicene from being utilized in a transistor device. The pristine properties of two-dimensional materials, such as silicene, are not being preserved from degradation when exposed to air. As a result, there is not currently a means for effectively protecting highly air-sensitive two-dimensional Xene materials, such as silicene, germanene, stanene and phosphorene, during the transfer and device fabrication.

SUMMARY

In one embodiment of the present invention, a method for fabricating a field-effect transistor comprises depositing a film of air-sensitive two-dimensional material on a crystallized metallic thin film on a substrate. The method further comprises depositing a capping layer of insulating material on the air-sensitive two-dimensional material. The method additionally comprises detaching the substrate from the metallic thin film/air-sensitive two-dimensional material/insulating material stack structure. Furthermore, the method comprises flipping the metallic thin film/air-sensitive two-dimensional material/insulating material stack structure. Additionally, the method comprises attaching the flipped metallic thin film/air-sensitive two-dimensional material/insulating material stack structure to a device substrate. In addition, the method comprises etching the metallic thin film forming contact electrodes.

In another embodiment of the present invention, a field-effect transistor comprises a substrate. The field-effect transistor further comprises a dielectric layer positioned on the substrate. The field-effect transistor additionally comprises a layer of insulating material positioned on the dielectric layer. Additionally, the field-effect transistor comprises a layer of air-sensitive two-dimensional material positioned on the insulating layer. Furthermore, the field-effect transitory comprises a channel of said air-sensitive two-dimensional material defined atop the insulating layer. In addition, the field-effect transistor comprises a layer of metallic film positioned on the layer of air-sensitive two-dimensional material. The field-effect transistor further comprises a drain contact defined in the metallic film. The field-effect transistor additionally comprises a source contact defined in the metallic film.

The foregoing has outlined rather generally the features and technical advantages of one or more embodiments of the present invention in order that the detailed description of the present invention that follows may be better understood. Additional features and advantages of the present invention will be described hereinafter, which may form the subject of the claims of the present invention.

BRIEF DESCRIPTION OF THE DRAWINGS

A better understanding of the present invention can be obtained when the following detailed description is considered in conjunction with the following drawings, in which.

DETAILED DESCRIPTION

Figure 1:
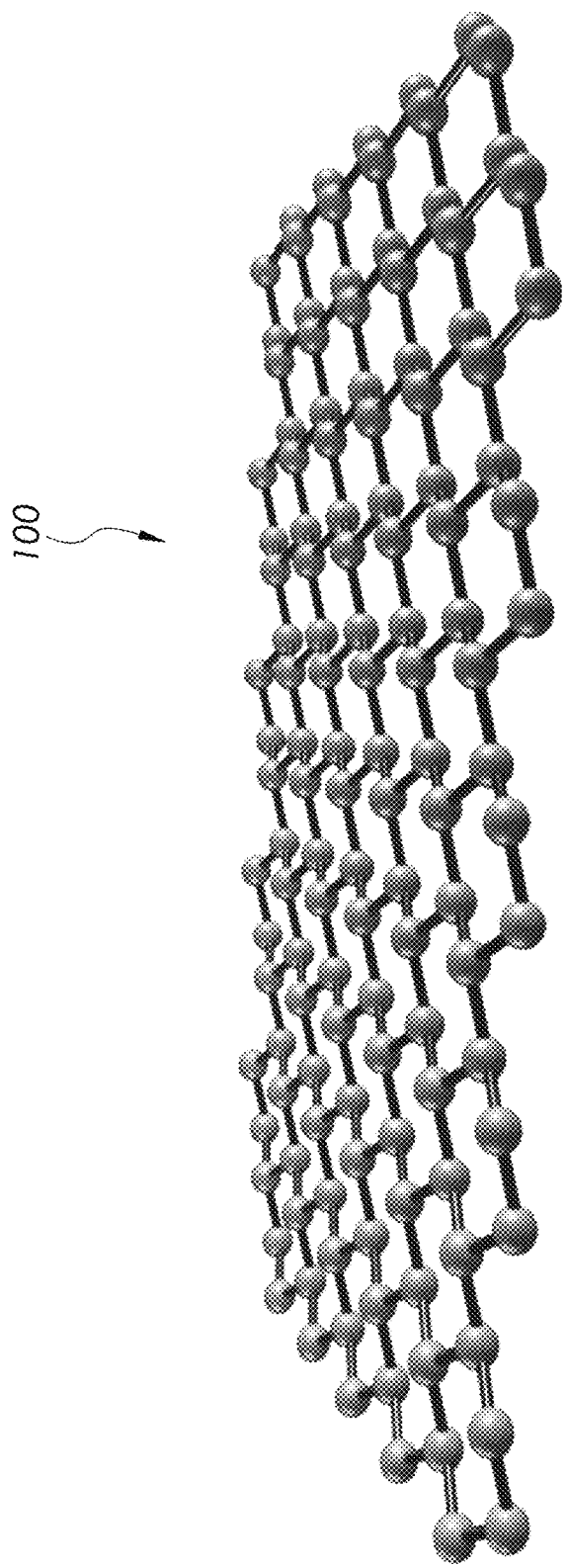
FIG. 1 illustrates a buckled two-dimensional silicon in accordance with an embodiment of the present invention.

The surface sensitivity of silicene derives from its mixed sp2-sp3 character, and, as such, requires effective passivation or encapsulation at all stages from material synthesis to device fabrication. Although buckled two-dimensional silicon 100, as illustrated in FIG. 1 in accordance with an embodiment of the present invention, was foreseen two decades ago, its instability in air has severely limited investigations of its experimental properties. The principles of the present invention overcome this limitation using a synthesis-transfer-fabrication process denoted as "silicene encapsulated delamination with native electrodes (SEDNE)" as discussed herein.

Figure 2:
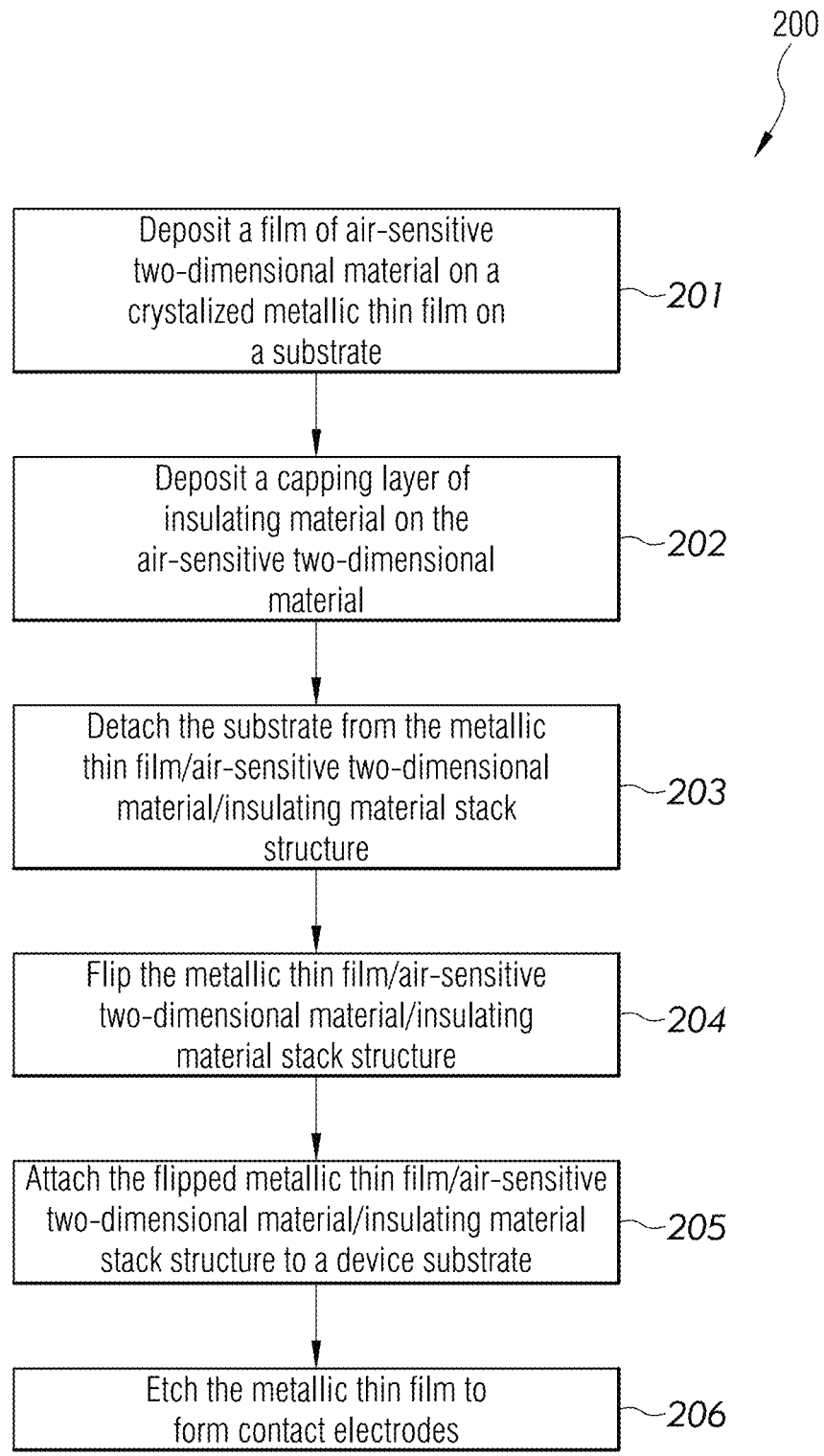
FIG. 2 is a flowchart of a method for using the silicene encapsulated delamination with native electrodes (SEDNE) process in accordance with an embodiment of the present invention.

FIG. 2 is a flowchart of a method for using the SEDNE process in accordance with an embodiment of the present invention. FIG. 2 will be discussed below in conjunction with FIGS. 3A-3E, which depict cross-sectional views of fabricating a field-effect transistor using the steps described in FIG. 2 in accordance with an embodiment of the present invention.

Figure 3A:
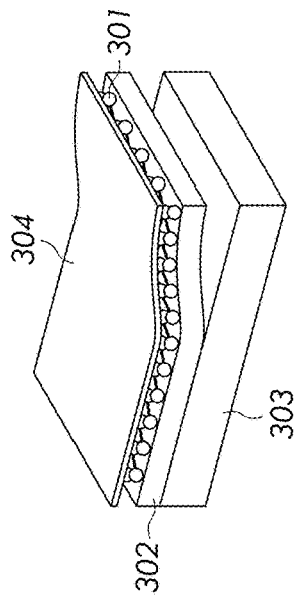
FIGS. 3A-3E depict cross-sectional views of fabricating a field-effect transistor using the steps described in FIG. 2 in accordance with an embodiment of the present invention.
Figure 3B:
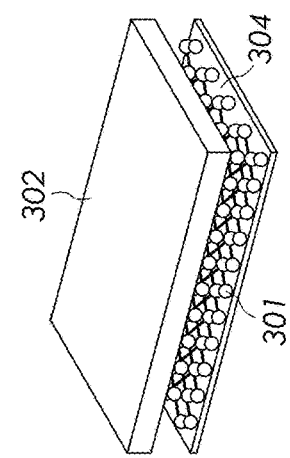

Referring to FIG. 2, in step 201, a film of air-sensitive two-dimensional material 301, such as silicene, germanene, stanene or phosphorene, is deposited (epitaxially grown) on a crystalized metallic thin film 302 on a substrate 303 as shown in FIGS. 3A and 3B. In one embodiment, air-sensitive two-dimensional material 301 is any two-dimensional material of an element from Group IV or Group V in the periodic table. In one embodiment, air-sensitive two-dimensional material 301 is silicene, germanene, stanene or phosphorene. In one embodiment, the crystalized metallic thin film 302 is a crystalized thin film of a face centered cubic metal, such as Ag(111), as discussed further below. In one embodiment, substrate 303 is a cleavable substrate, such as mica, as discussed further below.

In step 202, a capping layer of insulating material 304 is deposited on the air-sensitive two-dimensional material 301 as shown in FIG. 3B. In one embodiment, insulating material 304 is aluminum oxide as discussed further below.

Figure 3C:
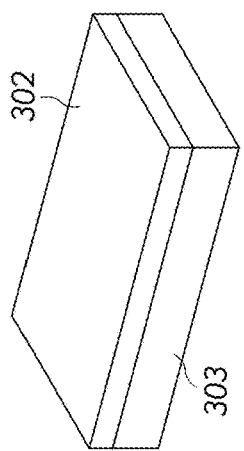

In step 203, substrate 303 is detached (via cleaving or tape peeling) from the metallic thin film/air-sensitive two-dimensional material/insulating material stack structure (302/301/304) as shown in FIG. 3C.

In step 204, the metallic thin film/air-sensitive two-dimensional material/insulating material stack structure (302/301/304) is flipped as shown in FIG. 3C.

Figure 3D:
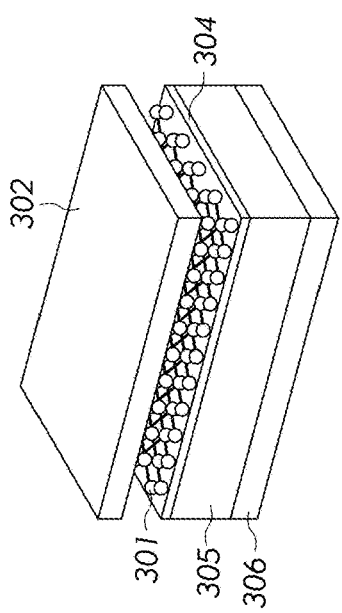

In step 205, the flipped metallic thin film/air-sensitive two-dimensional material/insulating material stack structure (302/301/304) is attached to a device substrate as shown in FIG. 3D. In one embodiment, the device substrate includes a dielectric layer 305, such as silicon dioxide, positioned on a substrate 306, such as silicon, as discussed further below. In one embodiment, the thickness of the layers 304/305 is approximately between 5 and 500 nanometers. In one embodiment, the thickness of substrate 306 is approximately 500 micrometers.

Figure 3E:
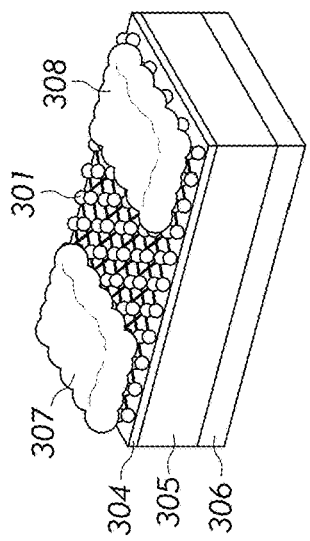

In step 206, metallic thin film 302 is etched to form contact electrodes (drain 307, source 308) as shown in FIG. 3E.

A more detailed description of method 200 is provided below. While the following discusses method 200 in connection with the air-sensitive two-dimensional material of silicene, the principles of the present invention may be applied to any air-sensitive two-dimensional material, such as any two-dimensional material of an element from Group IV or Group V in the periodic table, such as from germanium or tin. An air-sensitive two-dimensional refers to any two-dimensional material that degrades when exposed to air. A person of ordinary skill in the art would be capable of applying the principles of the present invention to such implementations. Further, embodiments applying the principles of the present invention to such implementations would fall within the scope of the present invention.

Furthermore, while the following discusses method 200 in connection with using a Ag(111) thin film 302, a mica substrate 303, a capping layer of aluminum oxide 304, a dielectric layer 305 of silicon dioxide and a silicon substrate 306, the principles of the present invention are not to be limited to such materials. The following discussion pertains to one embodiment for effectively protecting highly air-sensitive two-dimensional materials during the transfer and device fabrication.

Referring to FIGS. 2 and 3A-3E, some of the key innovations in method 200 include: (1) epitaxial silicene 301 synthesis on deposited Ag(111) thin film 302 on cleavable mica substrate 303 instead of expensive single-crystal bulk Ag; (2) encapsulated delamination transfer of silicene 301 sandwiched between $Al_2O_3$ 304 and native Ag thin films 302 that enables substrate 303 reuse, unlike the normal wet transfer technique, which sacrifices the growth substrate; and (3) reuse of the native Ag film 302 to stabilize silicene 301 and serve as contact electrodes 307, 308. Growth of silicene 301 on the Ag(111)/mica substrate (302/303) was monitored by RHEED and in situ STM.

Material synthesis was performed in a system including an ultrahigh-vacuum chamber at a base pressure of $10^{-10}$ $10^{-11}$ mbar ($7.5 \times 10^{-11}$ $10^{-12}$ torr), with three interconnected chambers for sample processing, chemical analysis and in situ STM characterization. Several cycles of Ar+ ion sputtering (1 keV) were first performed on the Ag(111)/mica substrate (302, 303) to reveal a clean surface, followed by annealing at 530° C. for 30 minutes. Silicene film 301 was deposited on the processed Ag(111) surface 302 from a heated crucible in the built-in evaporator at a temperature of 250-270° C. and a rate of $2-6 \times 10^{-2}$ monolayers per minute. In situ RHEED (30 keV) and STM (sample bias of −1.4 V and tunneling current of 0.5 nA) were used to monitor the real-time growth and phase characterization. A non-reactive in situ capping procedure was adopted to protect epitaxial silicene 301 on Ag(111) 302 by means of reactive molecular beam deposition of $Al_2O_3$ with a thickness of 5 nm. Raman spectroscopy was performed in a Renishaw In-via spectrometer with a 442 nm (2.81 eV) He—Cd blue laser at 4 mW of power. The surface morphology of the transferred silicene and the fabricated device was measured by a Veeco Digital Instrument AFM in tapping mode.

As shown in FIGS. 3A-3E, an encapsulated delamination transfer was used to transfer silicene film 301 in between the $Al_2O_3$ capping layer 302 and Ag film layer 304 from a mica growth substrate 303 to the device substrate 305/306. A blade (or tape) initiated a gap at the edge of the sample between the Ag and mica interface (302/303), allowing the $Al_2O_3$/silicene/Ag film stack (304/301/302) to be peeled off. The encapsulated silicene 301 (between $Al_2O_3$ and Ag) (304/302) was then placed on a device substrate (e.g., 90-nm-thick $SiO_2$ on highly-doped Si) with the $Al_2O_3$ layer 304 facing downward in contact with the $SiO_2$ layer 305. The silicene channel (601 as discussed below in connection with FIG. 6A) as well as drain/source electrodes 307, 308 (in native Ag catalyst film) were patterned using electron beam lithography followed by etching to produce backgate transistor devices. To prevent rapid degradation/oxidation of silicene (as observed with commonly used Ag etchants such as nitric acid), a potassium iodide- and iodine-based etchant was developed. This provides a short but sufficient time window to capture the charge transportation behavior in Ag-free silicene before its degradation in ~2 min in air. With this in mind, the fabricated back-gated transistor device (discussed below in connection with FIGS. 6A and 6B) was measured immediately on a Cascade or Lakeshore probe station with an Agilent 4156 analyzer using $V_d$=20 mV with $V_g$ swept from –2 to 2 V under ambient conditions. A well accepted ambipolar graphene FET diffusive model was used to extract the field-effect mobility, contact resistance and residual carrier density from the $I_d$ versus $V_g$ measurement data.

Figure 4A:
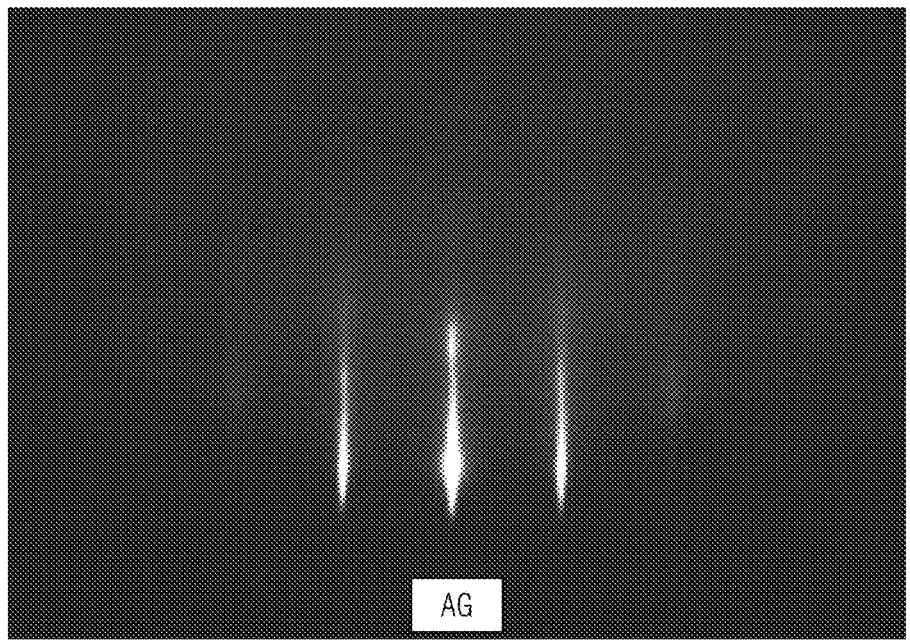
FIG. 4A illustrates the real-time reflection high-energy electron diffraction (RHEED) pattern of a pristine Ag(111) surface in accordance with an embodiment of the present invention.
Figure 4B:
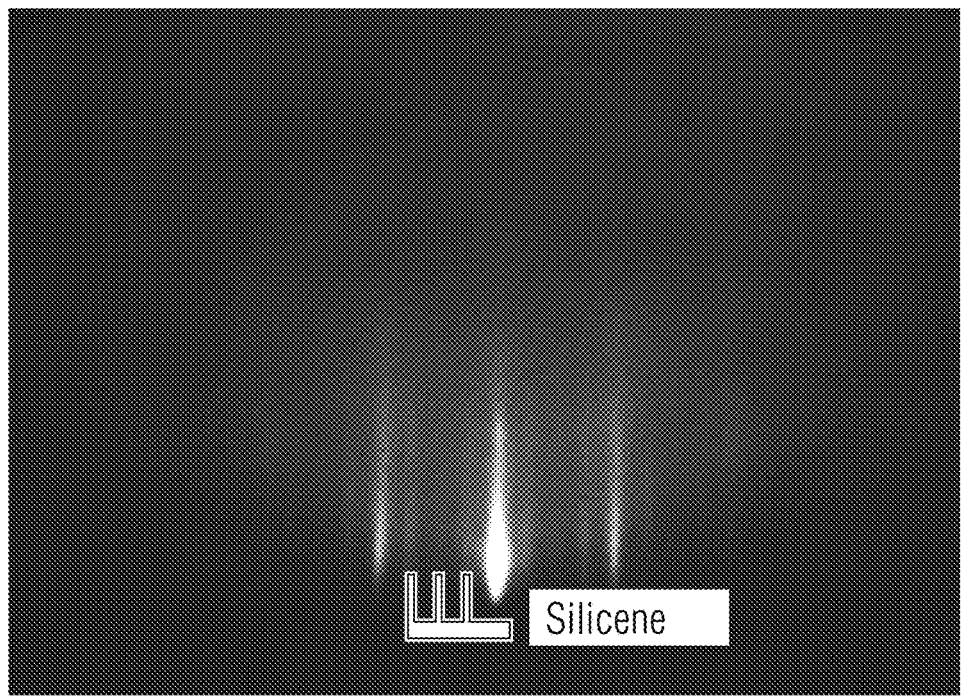
FIG. 4B illustrates the RHEED pattern of the silicene on Ag(111) in accordance with an embodiment of the present invention.
Figure 4C:
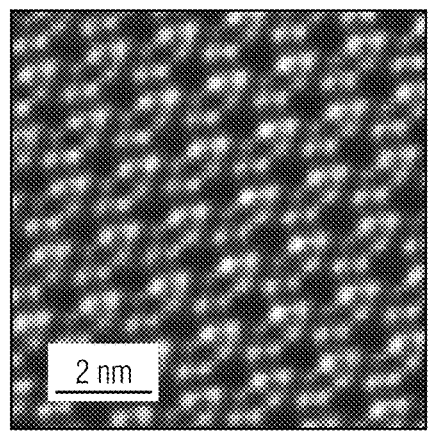
FIG. 4C is a scanning tunneling microscopy (STM) image of the (4×4) silicon overlayer in accordance with an embodiment of the present invention.
Figure 4D:
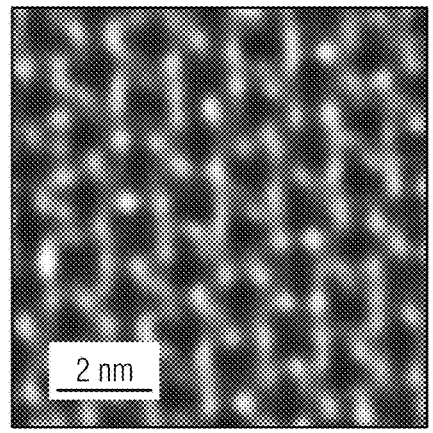
FIG. 4D is an STM image of the ($\sqrt{13}\times\sqrt{13}$) silicon overlayer in accordance with an embodiment of the present invention.
Figure 4E:
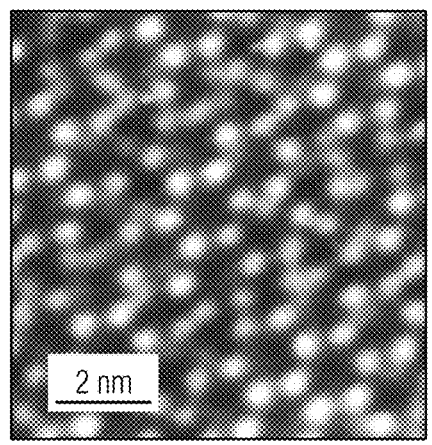
FIG. 4E is an STM image of the ($2\sqrt{3}\times2\sqrt{3}$) silicon overlayer in accordance with an embodiment of the present invention.

Referring to FIGS. 4A and 4B, FIG. 4A illustrates the RHEED pattern of a pristine Ag(111) surface in accordance with an embodiment of the present invention. FIG. 4B illustrates the RHEED pattern of the silicene on Ag(111) in accordance with an embodiment of the present invention. When compared to the RHEED pattern of a pristine Ag(111) surface as shown in FIG. 4A, a new set of sub-streaks arising from the silicene are observed in FIG. 4B. This epitaxial growth leads to a variety of coexisting silicene domains with different periodic order, where the amount depends on the deposition temperature. Here, despite the multiphase character of the silicene monolayer, two configurations have been selected, which, after careful optimization of the growth conditions, exhibit majority concentrations of the (4×4) and ($\sqrt{13}\times\sqrt{13}$) phases, plus a lesser amount of the ($2\sqrt{3}\times2\sqrt{3}$) phase, which are clearly distinguished by STM as shown in FIGS. 4C-4E. FIG. 4C is an STM image of the (4×4) silicon overlayer in accordance with an embodiment of the present invention. FIG. 4D is an STM image of the ($\sqrt{13}\times\sqrt{13}$) silicon overlayer in accordance with an embodiment of the present invention. FIG. 4E is an STM image of the ($2\sqrt{3}\times2\sqrt{3}$) silicon overlayer in accordance with an embodiment of the present invention. The STM images of FIGS. 4C-4E are 10×10 $nm^2$ and were acquired with a sample bias of 1.4 V and tunneling current of 0.5 nA. These phases are consistent with the growth mode and atomistic details of previously reported superstructures of epitaxial silicene monolayer on Ag(111) (obtained by means of atomically resolved microscopy and diffraction).

Raman spectroscopy was used as a routine method to verify the integrity of silicene 301 on Ag(111) 302. A typical Raman spectrum of silicene 301 is dominated by the presence of a sharp and intense peak in the 515-522 $cm^{-1}$ range, induced by the symmetric stretching of Si—Si atoms in planar hexagons ($E_{2g}$ vibrational modes). Additionally, the vertical buckling is responsible for the $A_{1g}$ breathing mode, which generates the asymmetric shoulder in the 450-500 $cm^{-1}$ range otherwise absent in bulk $sp^3$Si. By comparing Raman spectra as a function of the excitation energy, resonant and non-resonant behaviors can be associated, respectively, with the corresponding superstructures of Ag-supported silicene, which hint at different electronic structures.

Figure 5A:
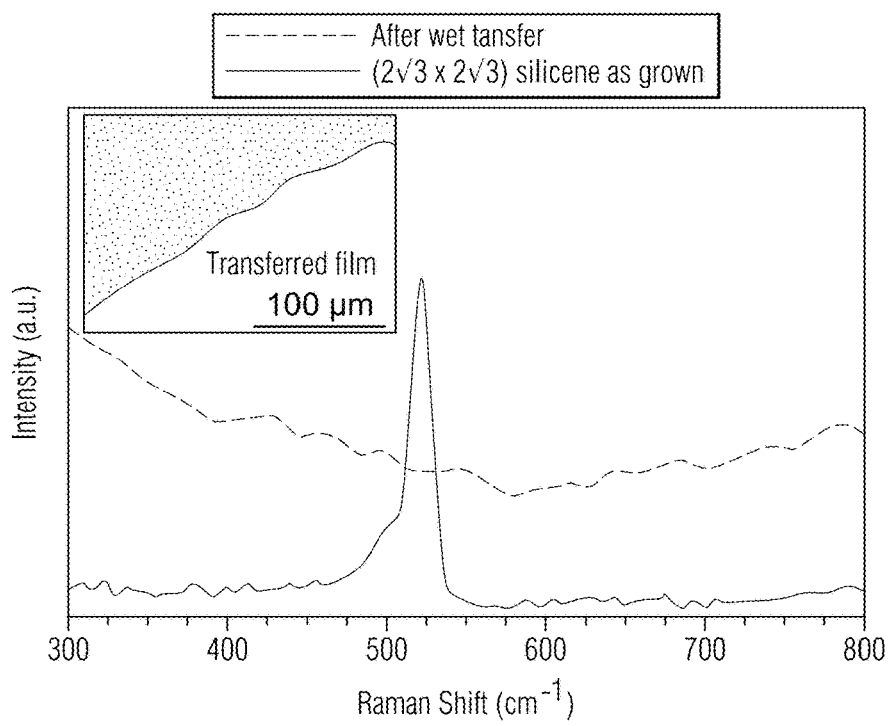
FIG. 5A illustrates the Raman spectra of ($2\sqrt{3}\times2\sqrt{3}$) silicene as grown and after wet transfer in accordance with an embodiment of the present invention.
Figure 5B:
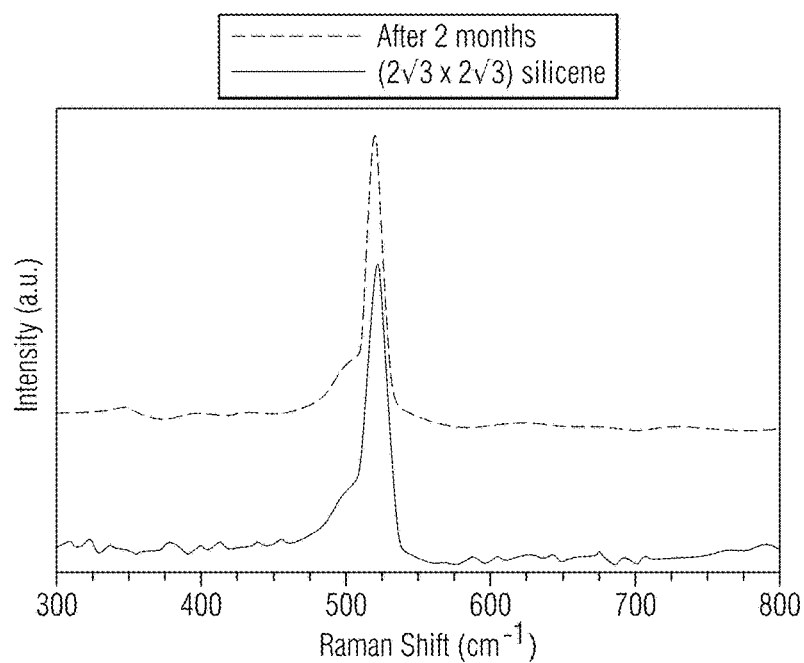
FIGS. 5B and 5C illustrate the Raman spectra of ($2\sqrt{3}\times2\sqrt{3}$) silicene and ($\sqrt{13}\times\sqrt{13}$) and (4×4) mixed-phase silicene before and after two months of storage in an approximately 30 mbar rough vacuum at room temperature, respectively, in accordance with an embodiment of the present invention.
Figure 5C:
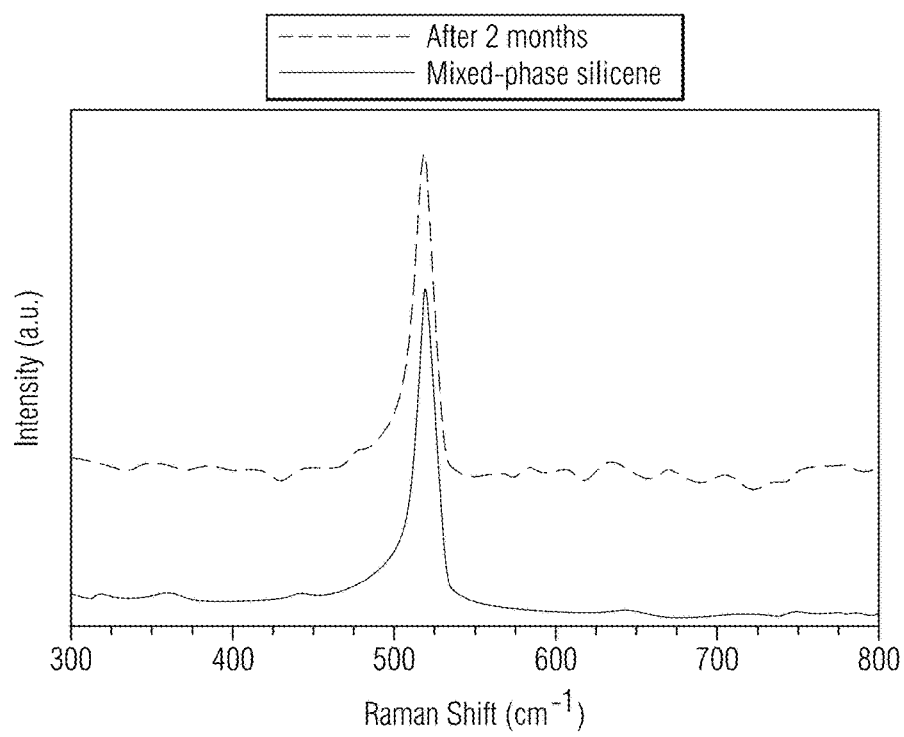
Figure 5D:
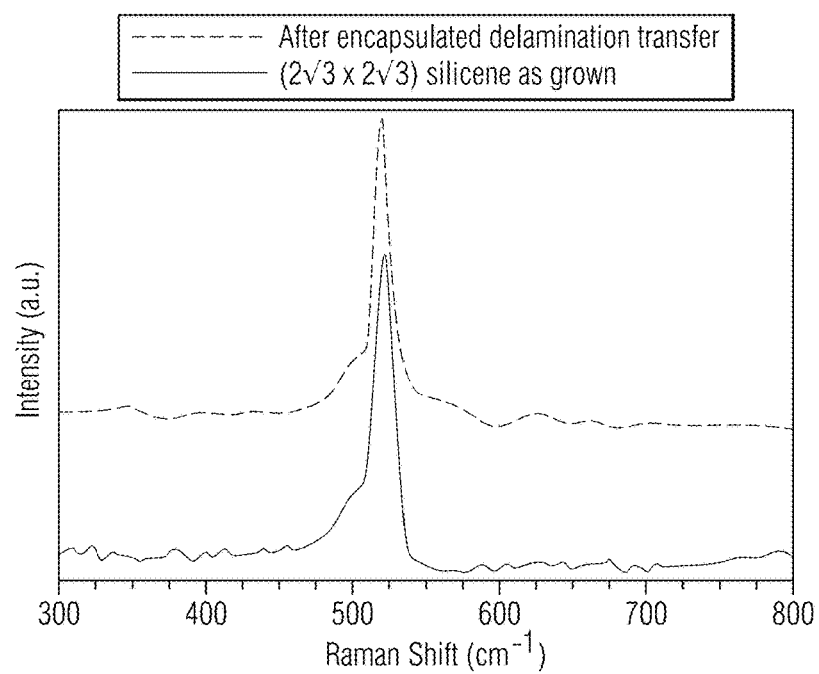
FIG. 5D illustrates the Raman signatures of ($2\sqrt{3}\times2\sqrt{3}$) silicene as grown and 7 days after the encapsulated delamination transfer in accordance with an embodiment of the present invention.

Unlike graphene, exposed silicene is generally unstable in air. This makes it unfeasible to transfer silicene via the widely used wet transfer technique, and even $Al_2O_3$-capped silicene degrades readily once the Ag is removed during transfer as shown in FIG. 5A, which illustrates the Raman spectra of ($2\sqrt{3}\times 2\sqrt{3}$) silicene as grown and after wet transfer in accordance with an embodiment of the present invention, because of the exposed bottom surface. FIGS. 5B and 5C illustrate the Raman spectra of ($2\sqrt{3}\times2\sqrt{3}$) silicene and ($\sqrt{13}\times\sqrt{13}$) and (4×4) mixed-phase silicene before and after two months of storage in an approximately 30 mbar rough vacuum at room temperature, respectively, in accordance with an embodiment of the present invention. As illustrated in FIGS. 5B and 5C, the Raman characteristics of certain silicene phases with $Al_2O_3$ capping and a native Ag layer appear to be preserved indefinitely (tracked for two months) when stored in a rough vacuum (~30 mbar) at room temperature. This is experimental evidence supporting density functional theory predictions that p-d hybridization of Si—Ag stabilizes silicene 301 grown on Ag(111) 302, and such an interaction could substantially affect the material properties of silicene 301. Therefore, a new encapsulated delamination transfer process was conceived to preserve the silicene-Ag interface (301/302) during transfer and subsequent device fabrication. The surface morphology and Raman spectra of silicene-Ag (301/302) taken 7 days after transfer, as shown in FIG. 5D which illustrates the Rama signatures of ($2\sqrt{3}\times2\sqrt{3}$) silicene as grown and 7 days after the encapsulated delamination transfer in accordance with an embodiment of the present invention, remain the same as those of the freshly grown sample, indicating that pristine silicene was preserved.

Given the essential role of Si—Ag interaction in stabilizing silicene, device fabrication following the encapsulated delamination transfer of silicene 301 takes an etch-back approach to define drain/source contacts 307, 308 in the native Ag film 302. To prevent rapid oxidation from the commonly used Ag etchant, a potassium iodide-based iodine-containing solution was devised to etch Ag 302 without causing instant damage to silicene 301 underneath.

Figure 6A:
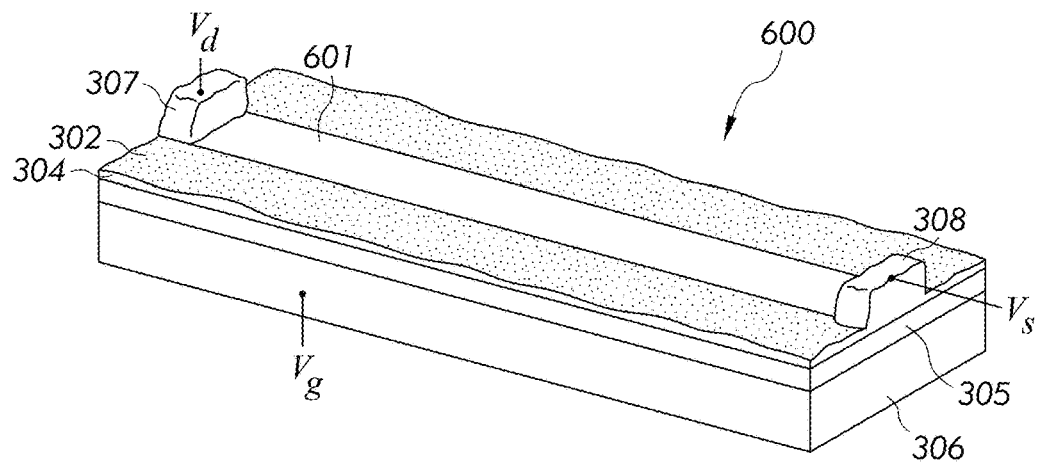
FIG. 6A illustrates a field-effect transistor (FET) using the method of FIG. 2 in accordance with an embodiment of the present invention.
Figure 6B:
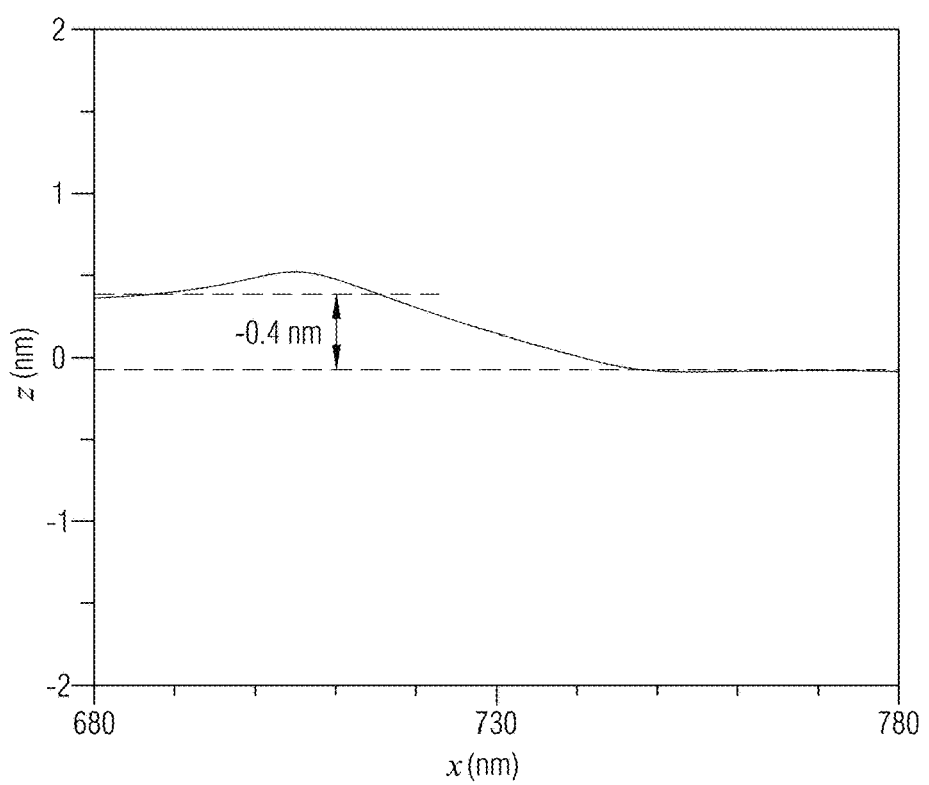
FIG. 6B illustrates the cross-section height profile, taken along the dashed line in FIG. 6A, in accordance with an embodiment of the present invention.

FIG. 6A illustrates a FET 600 using the method of 200 in accordance with an embodiment of the present invention. Referring to FIG. 6A, in conjunction with FIGS. 2 and 3A-3E, field effect transistor 600 includes drain and source electrodes 307, 308 defined in the native metallic film 302 (e.g., silver film) at both ends of the channel 601 of air-sensitive two-dimensional material (e.g., silicene 301), where channel 601 is defined atop insulating material 304. Furthermore, field-effect transistor 600 includes the metallic film 302 positioned on the two-dimensional material 301 (e.g., silicene) which is positioned on the insulating material 304 (e.g., $Al_2O_3$) which is positioned on dielectric layer 305 (e.g., $SiO_2$) which is positioned on substrate 306 (e.g., Si substrate). FIG. 6B illustrates the cross-section height profile, taken along the dashed line in FIG. 6A, in accordance with an embodiment of the present invention.

In one embodiment, insulating material 304 (e.g., aluminum oxide) has a thickness of approximately between 3 and 50 nanometers. In one embodiment, the thickness of the dielectric layer 305 (e.g., $SiO_2$) is approximately between 5 and 500 nanometers. In one embodiment, the thickness of dielectric layer 305 and p-type substrate 306 (e.g., Si substrate) is approximately 500 micrometers. In one embodiment, the thickness of the channel 601 of air-sensitive two-dimensional material is approximately between 0.3 and 1 nanometer. In one embodiment, the thickness of drain and source contacts 307, 308 is approximately between 50 and 500 nanometers.

Figure 7A:
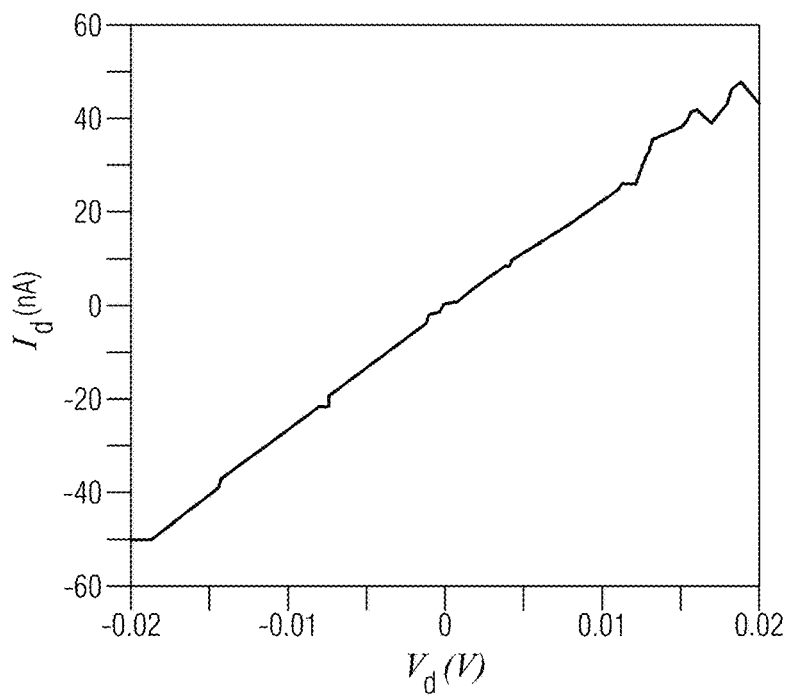
FIG. 7A illustrates the low-field linear $I_d$ versus $V_d$ response at $V_g=0$ in accordance with an embodiment of the present invention.

As illustrated in FIG. 6B, the step profile measured by atomic force microscopy (AFM) indicates a thickness of channel 601 of ~0.4 nm, consistent with monolayer silicene. Electrostatic transfer and output measurements were subsequently performed using the highly doped silicon substrate as the backgate. In brief, electrical measurements on such silicene transistors under ambient conditions revealed transport behavior similar to graphene, due to their analogous Dirac band structures. A linear drain current output ($I_d$) to drain voltage ($V_d$) relation is typically observed in silicene FETs with native Ag electrodes, indicating an ohmic contact under ambient conditions as illustrated in FIG. 7A, which illustrates the low-field linear $I_d$ versus $V_d$ response at $V_g=0$ in accordance with an embodiment of the present invention. The response curve of $I_d$ or $R=V_d/I_d$ to backgate voltage $V_g$ defines important transistor parameters, such as (1) on/off ratio, as the measured maximum over minimum value of $I_d$ ($I_{max}/I_{min}$) or R ($R_{max}/R_{min}$), and (2) Dirac voltage ($V_{Dirac}$) as the gate voltage where $R_{max}$ occurs.

Figure 7B:
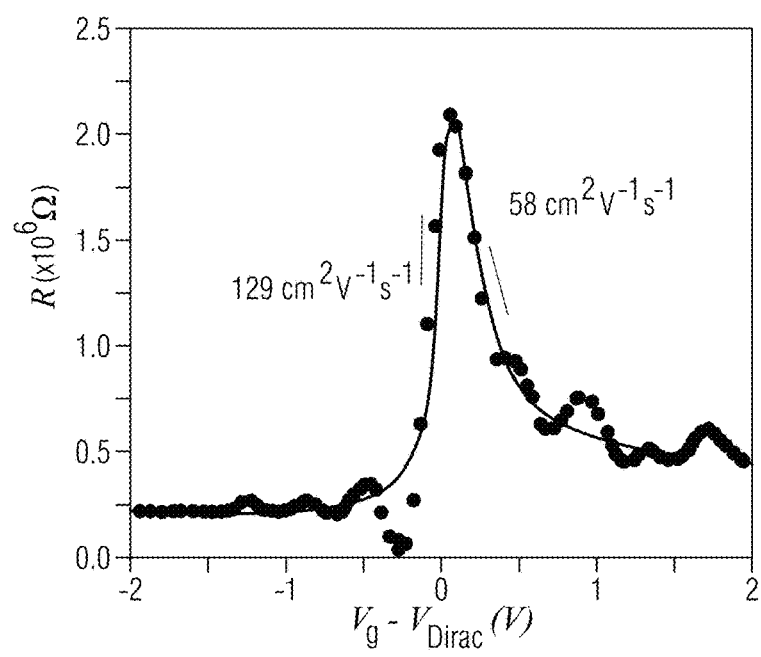
FIGS. 7B and 7C illustrate R versus ($V_g-V_{dirac}$) of silicene devices 1 and 2, respectively, in accordance with an embodiment of the present invention.
Figure 7C:
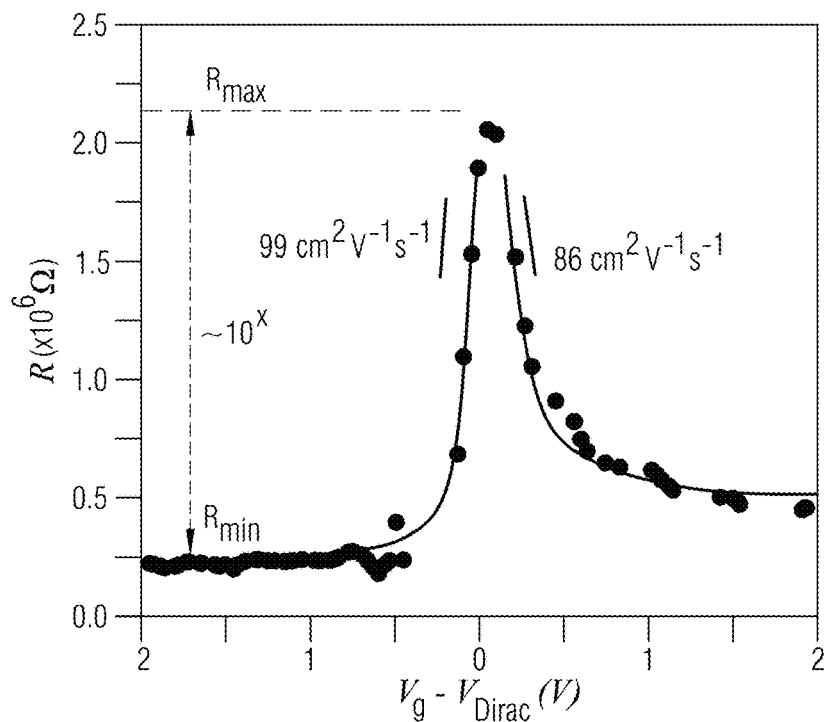

FIGS. 7B and 7C illustrate R versus ($V_g-V_{dirac}$) of silicene devices 1 and 2, respectively, in accordance with an embodiment of the present invention. Silicene devices 1 and 2 are from the same mixed-phase silicene sample, with the length of channel 601 of 1.8 μm and width of 230 nm and fixed $V_d=20$ mV for the measurements. The transfer characteristics of several measured FETs (FIGS. 7B and 7C) provide device evidence of silicene's Dirac-like band structure. FIG. 7B presents R versus gate overdrive voltage ($V_g-V_{Dirac}$) from device 1 (FIG. 7A) on a mixed-phase silicene, which contain ($\sqrt{13}\times\sqrt{13}$) as well as (4×4) superstructures. Another transfer characteristic from device 2 on the same mixed-phase silicene is shown in FIG. 7C, with an on/off ratio of about one order of magnitude. As illustrated in FIGS. 7B and 7C, the measured transfer characteristics (dots) are in good agreement with a widely used ambipolar diffusive transport model (line), which yields extracted low-field hole and electron carrier mobilities of 129 and 99 cm$^2$ V$^{-1}$ s$^{-1}$ and 58 and 86 cm$^2$ V$^{-1}$ s$^{-1}$ in devices 1 and 2, respectively, with similar residual carrier concentration of ~3-7×10$^9$ cm$^{-2}$, more than one to two order(s) of magnitude lower than in graphene transistors.

Figure 7D:
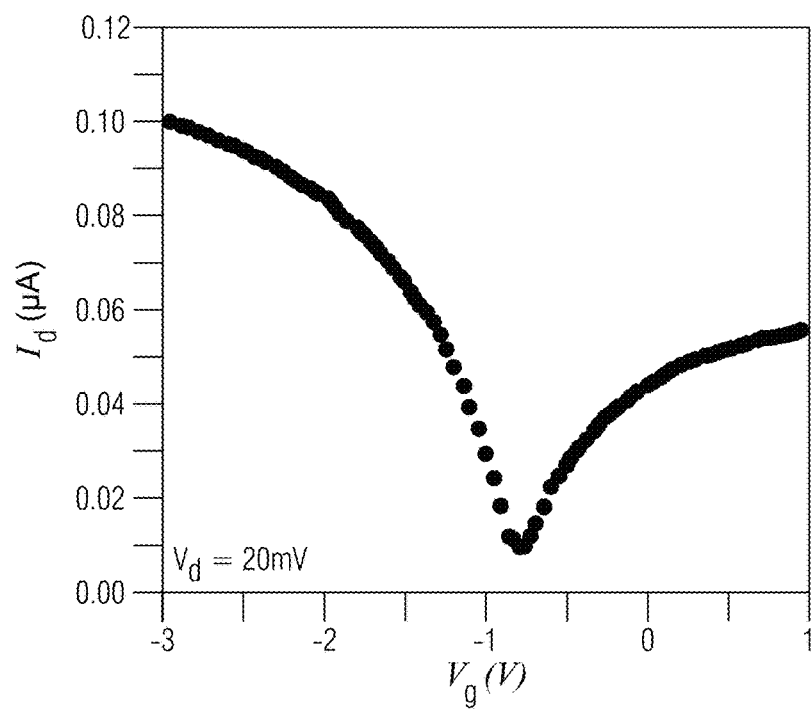
FIG. 7D illustrates the $I_d$ versus $V_g$ curve of silicene device 2 which displays ambipolar electron-hole symmetry expected from silicene in accordance with an embodiment of the present invention.

FIG. 7D illustrates the $I_d$ versus $V_g$ curve of silicene device 2 which displays ambipolar electron-hole symmetry expected from silicene in accordance with an embodiment of the present invention. In particular, FIG. 7D shows the V-shape $I_d$ versus $V_g$ curve from device 2, with $V_{Dirac}<|1|V$, indicating negligible impurity doping as a result of the clean delamination transfer, which is rarely observed in similar backgate FETs made from graphene using an established wet transfer process. By using a well-accepted ambipolar diffusive model for graphene FETs, silicene hole and electron mobilities were extracted as 129 and 58 cm$^2$ V$^{-1}$ s$^{-1}$, respectively, with a residual carrier concentration ($n_o$) at the Dirac point of 2.6-7.2×10$^9$ cm$^{-2}$ for device 1. For device 2, the extracted hole and electron mobilities were 99 and 86 cm$^2$ V$^{-1}$ s$^{-1}$, respectively, with a $n_o$ of 3.5-7.6×10$^9$ cm$^{-2}$. A similar ambipolar transfer behavior applies to silicene FET made from the ($2\sqrt{3}\times2\sqrt{3}$) phase. The observation of an ambipolar character irrespective of the silicene phase can be rationalized by the predicted band structure of silicene, where a Dirac cone is expected from ($\sqrt{13}\times\sqrt{13}$) and ($2\sqrt{3}\times 2\sqrt{3}$) phases after removal of the Ag support. Overall, the mobility values measured for silicene devices are of the order of 100 cm$^2$ V$^{-1}$ s$^{-1}$, which is within the estimated range of 10-1,000 cm$^2$ V$^{-1}$ s$^{-1}$ for supported silicene from recent theoretical calculations. Control group devices ruled out the possibility of channel current from monolayer amorphous Si or 5-nm Al$_2$O$_3$ capping layer. On the other hand, thin Ag residue exhibits a metallic linear current-voltage response (drain current three orders higher than in silicene devices) with no gate modulation. Importantly, the exposed silicene channel loses its Raman and electrical signatures in ~2 min in air, probably as a result of degrading to an amorphous or oxide insulator. Hence, it can be concluded that the observed ambipolar character in FIGS. 7A-7D is indeed from the silicene channel 601.

New insights can also be gained from the room-temperate silicene transistor response. Notably, the residual carrier concentration, $n_o$, of silicene FETs is more than an order of magnitude lower than that of pristine graphene (~1.5×10$^{11}$ cm$^{-2}$) at 20° C., which, combined with the ≥10×$I_{max}/I_{min}$ ratio (larger than typical graphene FETs, ~5×), suggests that a small bandgap opening is present in the fabricated silicene FETs on Al$_2$O$_3$/SiO$_2$/p++ Si substrate (304, 305, 306). It is noted that the thermally generated $n_o$ of a Dirac semiconductor with zero bandgap has one material dependency, the Fermi velocity ($v_F$), where $n_o \propto (1/v_F^2)$. Because the Fermi velocity of silicene is comparable to graphene, the most plausible scenario to understand silicene's low $n_o$ necessitate a small bandgap opening. In the limit of a weak perturbation to the Dirac dispersion of Ag-free silicene, the small bandgap that yields $n_o\approx 8\times 10^9$ cm$^{-2}$ is calculated to be ~210 meV, an approximate value and, in principle, consistent with fundamental studies on the band sensitivity of silicene to interfaces.

Furthermore, the mobility values of the experimental silicene transistors are significantly lower than graphene given the same device configuration. Although some scattering mechanisms, such as remote phonon, charged impurity and disorders, are common to graphene and silicene synthesized two-dimensional materials, a principal mechanism responsible for the observed low mobility is understood to originate from the strong acoustic phonon scattering present in silicene. Unlike planar graphene, with its intrinsic reflection symmetry that suppresses out-of-plane acoustic (ZA) phonons, silicene's buckled structure breaks such symmetry with respect to the atomic plane, resulting in particularly strong ZA phonon scattering. Although pristine free-standing silicene is predicted to offer an intrinsic mobility of ~1,000 cm$^2$ V$^{-1}$ s$^{-1}$, the substrate effect on silicene's acoustic phonon energies and electron-phonon coupling is probably perturbed negatively across several separate transistor devices.

In summary, as discussed in connection with FIGS. 2 and 3A-3E, silicene 301 was grown on Ag(111) film 302 on mica 303 and verified via in situ characterizations. Encapsulated delamination transfer and native Ag contact were developed as key innovations, preserving the silicene 301 during transfer for device fabrication and measurements, and allowing the reuse of growth substrates.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A method for fabricating a field-effect transistor, the method comprising:
    depositing a film of air-sensitive two-dimensional material on a crystallized metallic thin film on a substrate;
    depositing a capping layer of insulating material on said air-sensitive two-dimensional material;
    detaching said substrate from said metallic thin film/air-sensitive two-dimensional material/insulating material stack structure;
    flipping said metallic thin film/air-sensitive two-dimensional material/insulating material stack structure;
    attaching said flipped metallic thin film/air-sensitive two-dimensional material/insulating material stack structure to a device substrate; and
    etching said metallic thin film forming contact electrodes.

2. The method as recited in claim 1, wherein said air-sensitive two-dimensional material comprises a two-dimensional material of an element from Group IV or Group V in a periodic table.

3. The method as recited in claim 1, wherein said air-sensitive two-dimensional material comprises one of the following: silicene, germanene, stanene and phosphorene.

4. The method as recited in claim 1, wherein said metallic thin film comprises silver.

5. The method as recited in claim 1, wherein said substrate comprises mica.

6. The method as recited in claim 1, wherein said insulating material comprises aluminum oxide.

7. The method as recited in claim 1, wherein said device substrate comprises a dielectric layer on a substrate.

8. The method as recited in claim 7, wherein said dielectric layer comprises silicon dioxide and said substrate comprises silicon.

9. The method as recited in claim 1, wherein said contact electrodes comprises a drain and a source contact.

10. The method as recited in claim 1, wherein said film of air-sensitive two-dimensional material was deposited on said crystalized metallic thin film from a heated crucible in a built-in evaporator at a temperature of approximately 250-270° C. and a rate of approximately $2-6\times10^{-2}$ monolayers per minute.

11. The method as recited in claim 1, wherein said insulating material was deposited on said film of air-sensitive two-dimensional material using a reactive molecular beam.

12. The method as recited in claim 1, wherein said insulating material comprises aluminum oxide, wherein said aluminum oxide has a thickness of approximately between 3 and 50 nanometers.

13. The method as recited in claim 1, wherein said substrate is detached from said metallic thin film/air-sensitive two-dimensional material/insulating material stack structure by initiating a gap at an edge between said metallic thin film and said substrate.

14. The method as recited in claim 1, wherein a blade is used to initiate said gap at said edge between said metallic thin film and said substrate.

15. The method as recited in claim 1, wherein a potassium iodide and iodine-based etchant is used to etch said metallic thin film to form said contact electrodes.

* * * * *